(12) United States Patent
Bchir et al.

(10) Patent No.: US 7,923,059 B2
(45) Date of Patent: Apr. 12, 2011

(54) METHOD OF ENABLING SELECTIVE AREA PLATING ON A SUBSTRATE

(75) Inventors: Omar J. Bchir, Phoenix, AZ (US); Houssam Jomaa, Phoenix, AZ (US); Islam A. Salama, Chandler, AZ (US); Yonggang Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 857 days.

(21) Appl. No.: 11/861,302

(22) Filed: Sep. 26, 2007

(65) Prior Publication Data
US 2009/0081381 A1   Mar. 26, 2009

(51) Int. Cl.
B05D 5/12 (2006.01)
B05D 1/32 (2006.01)

(52) U.S. Cl. ........... 427/97.2; 427/97.3; 427/98.4; 427/98.5; 427/282

(58) Field of Classification Search ........ 427/96.1, 427/97.1, 97.2, 97.3, 97.4, 97.5, 97.6, 97.7, 427/97.8, 97.9, 98, 98.1, 98.2, 98.3, 98.4, 427/98.5, 98.6, 98.7, 98.8, 98.9, 99, 99.1, 427/99.2, 99.3, 99.4, 99.5, 99.6, 99.7; 216/12, 216/13, 17, 18
See application file for complete search history.

(56) References Cited

U.S. PATENT DOCUMENTS

| | | | |
|---|---|---|---|
| 4,715,894 A * | 12/1987 | Holtzman et al. | 106/1.22 |
| 5,151,168 A | 9/1992 | Gilton et al. | |
| 6,998,339 B2 | 2/2006 | Ito | |
| 2006/0070769 A1 | 4/2006 | Kim | |

FOREIGN PATENT DOCUMENTS

JP   2006-274369 A   10/2006

OTHER PUBLICATIONS

International Search Report and Written Opinion for PCT Patent Application No. PCT/US2008/077612, Mailed Mar. 24, 2009, 11 Pages.
International Preliminary Report on Patentability, for PCT Application No. PCT/US2008/077612, Mailed on Apr. 8, 2010, 6 pages.
Omar J. Bchir, et al., "Method of Removing Unwanted Plated or Conductive Material From a Substrate, and Method of Enabling Metallization of a Substrate Using Same", filed Aug. 13, 2007 as U.S. Appl. No. 11/838,057.

* cited by examiner

*Primary Examiner* — Timothy H Meeks
*Assistant Examiner* — Collette Ripple
(74) *Attorney, Agent, or Firm* — Kenneth A. Nelson

(57) ABSTRACT

A method of enabling selective area plating on a substrate includes forming a first electrically conductive layer (310) over substantially all of the substrate, covering sections of the first electrically conductive layer with a mask (410) such that the first electrically conductive layer has a masked portion and an unmasked portion, forming a second electrically conductive layer (710, 1210), the second electrically conductive layer forming only over the unmasked portion of the first electrically conductive layer, and removing the mask and the masked portion of the first electrically conductive layer. In an embodiment, the mask covering sections of the first electrically conductive layer is a non-electrically conductive substance (1010) applied with a stamp (1020). In an embodiment, the mask is a black oxide layer.

8 Claims, 7 Drawing Sheets

METHOD OF ENABLING SELECTIVE AREA PLATING ON A SUBSTRATE

FIELD OF THE INVENTION

The disclosed embodiments of the invention relate generally to feature formation in microelectronic devices, and relate more particularly to selective area plating for embedded feature metallization in such devices.

BACKGROUND OF THE INVENTION

The creation of microelectronic devices typically requires the formation of traces or other features in the dielectric material (or another area) of a substrate. Laser projection patterning (LPP), which uses laser ablation to form such features, is one patterning technique that offers advantages for microelectronic applications. Many other patterning techniques also are used. After trenches and vias are ablated or otherwise formed in the dielectric material they must be filled with an electrically conductive material such as copper in order to create electrical interconnects in the substrate. Filling the trenches and vias using standard techniques that combine electroless and electrolytic plating processes requires some degree of overplating above the dielectric surface in order to ensure adequate filling of all traces, lands or planes, and vias on the substrate. The overplated electrically conductive material must then be removed from the substrate in order to electrically isolate the traces and vias from each other and from an integrated circuit.

The overplated material could be removed using chemical mechanical planarization (CMP), which is a standard process for removal of overplated copper in the silicon die fabrication process. However, the use of CMP for substrate manufacture is technically challenging due to manufacturing geometry and may cause problems, including scratching of the dielectric layer, which can create reliability concerns. In addition CMP is generally cost prohibitive in manufacturing organic substrates.

BRIEF DESCRIPTION OF THE DRAWINGS

The disclosed embodiments will be better understood from a reading of the following detailed description, taken in conjunction with the accompanying figures in the drawings in which.

Figure 1:
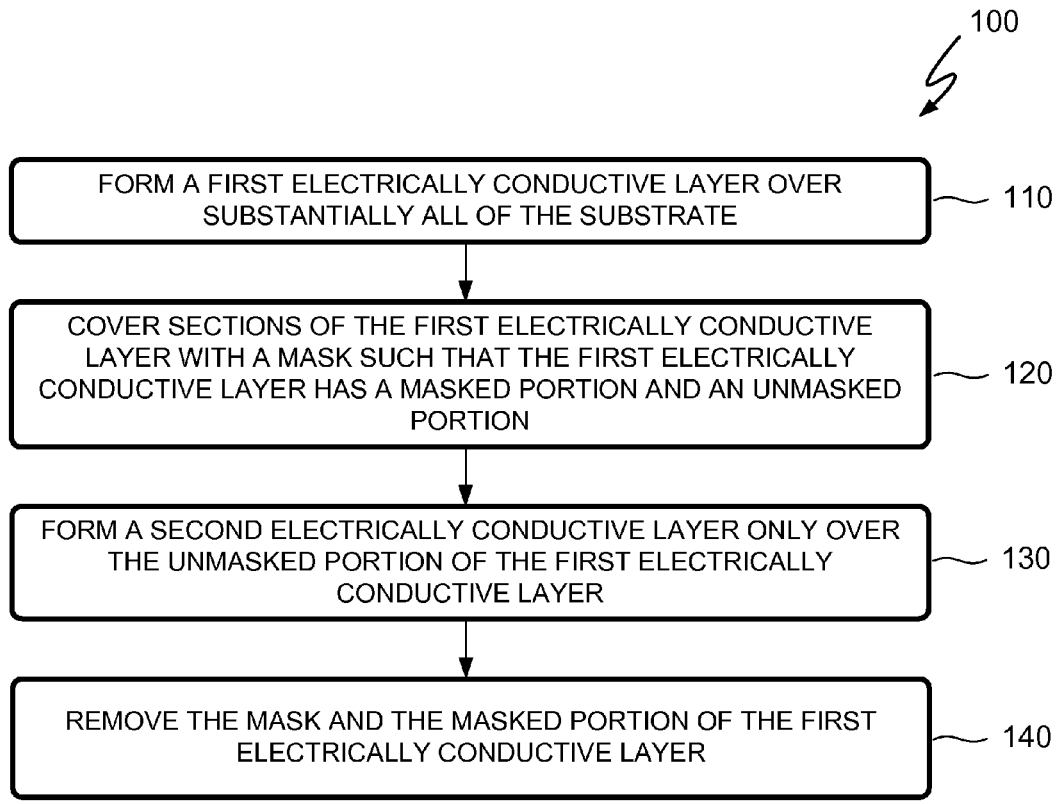
FIG. 1 is a flowchart illustrating a method of enabling selective area plating on a substrate according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a method of enabling selective area plating on a substrate comprises forming a first electrically conductive layer over substantially all of the substrate, covering sections of the first electrically conductive layer with a mask such that the first electrically conductive layer has a masked portion and an unmasked portion, forming a second electrically conductive layer, the second electrically conductive layer forming only over the unmasked portion of the first electrically conductive layer, and removing the mask and the masked portion of the first electrically conductive layer. In an embodiment, the mask covering sections of the first electrically conductive layer comprises a non-electrically conductive substance applied with a stamp. In an embodiment, the mask comprises a black oxide layer.

Embodiments of the invention enable substrate metallization using selective area plating without the reliability concerns caused by CMP-induced dielectric scratching. The disclosed methods are easily implemented and may provide a lower-cost route to substrate metallization than CMP, which requires significant infrastructure investment at the substrate factories.

Referring now to the drawings, FIG. 1 is a flowchart illustrating a method 100 of enabling selective area plating on a substrate according to a first embodiment of the invention. A step 110 of method 100 is to form a first electrically conductive layer over substantially all of the substrate.

Figure 2:
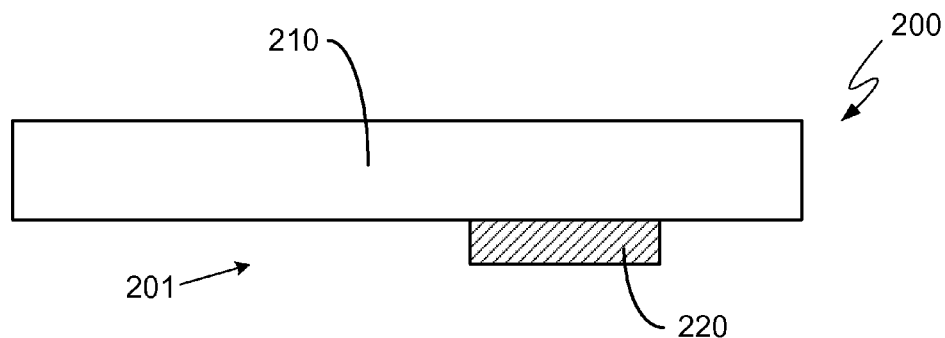
FIGS. 2-8 are cross-sectional views of a portion of a workpiece at various particular points in a manufacturing process according to a first embodiment of the invention.

FIG. 2 is a cross-sectional view of a portion of a workpiece 200 at a particular point in a manufacturing process according to an embodiment of the invention. As illustrated in FIG. 2, workpiece 200 comprises a dielectric layer 210 and a pad 220 under dielectric layer 210 that together form part of a substrate 201. As an example, pad 220 can be a copper pad or the like such as is frequently used for substrate metallization. As another example, the substrate referred to in step 110 of method 100 can be similar to substrate 201.

Figure 3:
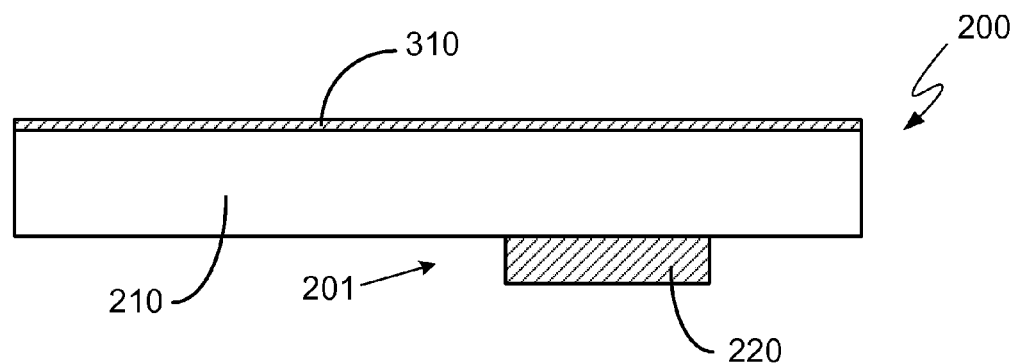

FIG. 3 is a cross-sectional view of a portion of workpiece 200 at a particular point in a manufacturing process according to a first embodiment of the invention. As an example, FIG. 3 may depict workpiece 200 following the performance of step 110 of method 100. As illustrated in FIG. 3, an electrically conductive layer 310 has been formed over substantially all of substrate 201. As an example, electrically conductive layer 310 may be a copper seed layer deposited in a manner to be described below.

A step 120 of method 100 is to cover sections of the first electrically conductive layer with a mask such that the first electrically conductive layer has a masked portion and an unmasked portion. In the first embodiment of the invention, step 120 comprises partially oxidizing the first electrically conductive layer in order to form a black oxide layer in a region of the first electrically conductive layer, and patterning the substrate in order to form therein a feature that extends through the black oxide layer and the first electrically conductive layer. In one embodiment, patterning the substrate comprises ablating a portion of the substrate using an excimer laser. Other embodiments use other lasers to accomplish the patterning. Still other embodiments use other patterning techniques capable of providing embedded trenches.

As an example, the black oxide layer may act as the mask mentioned in step 120. As may be seen, the masked portion has no features formed therein, and in the places where features are formed the mask has been removed. In at least one embodiment such removal of the mask is a direct result of the feature formation process itself.

Figure 4:
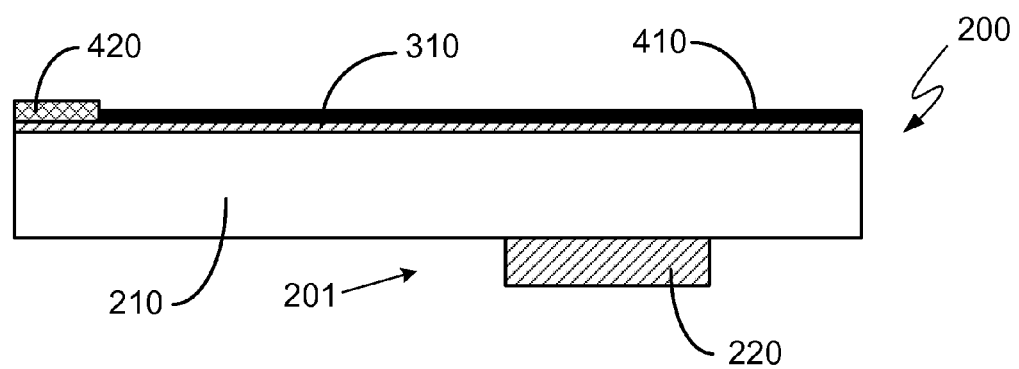

FIG. 4 is a cross-sectional view of a portion of workpiece 200 at a different point in a manufacturing process according to the first embodiment of the invention. As an example, FIG. 4 may depict workpiece 200 following the partial performance of step 120 of method 100. As illustrated in FIG. 4, a mask 410 has been formed over electrically conductive layer 310. For reasons that will be explained below, a mask 420 has been placed over a portion of substrate 201 in order to prevent the formation of mask 410 in that portion. As an example, the mask referred to in step 120 of method 100 can be similar to mask 410.

Figure 5:
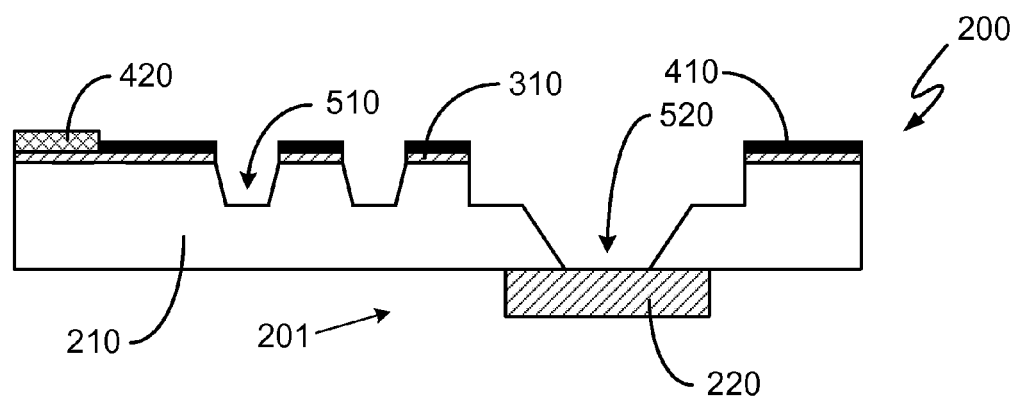

FIG. 5 is a cross-sectional view of a portion of workpiece 200 at a different point in a manufacturing process according to the first embodiment of the invention. As an example, FIG. 5 may depict workpiece 200 after step 120 of method 100 has been partially performed. As illustrated in FIG. 5, substrate 201 has been patterned such that it contains trenches 510 and a via 520. As an example, the feature referred to in connection with step 120 of method 100 can be similar to trenches 510 or via 520. Trenches 510 and via 520 cut through electrically conductive layer 310 and mask 410, thereby removing certain portions of those layers.

Figure 6:
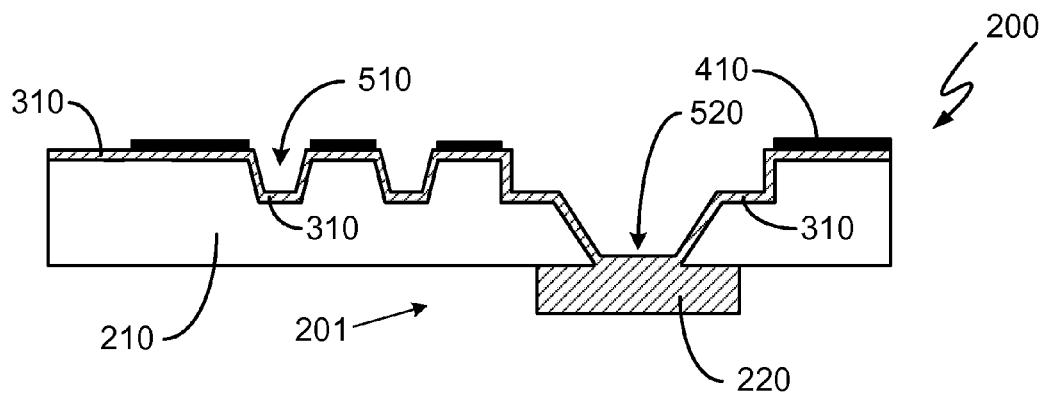

FIG. 6 is a cross-sectional view of a portion of workpiece 200 at a different point in a manufacturing process according to the first embodiment of the invention. As an example, FIG. 6 may depict workpiece 200 after step 120 of method 100 has been performed. As illustrated in FIG. 6, electrically conductive layer 310 has been extended such that it once again lies over substantially all of substrate 201. This extension of electrically conductive layer 310 may be accomplished by depositing a copper seed layer on the sidewalls and bottom of trenches 510 and via 520 using a process such as electroless copper plating, performed after mask 410 is applied. Accordingly, FIG. 6 depicts electrically conductive layer 310 having sections that are covered with mask 410, which sections together make up the masked portion mentioned above, and having other sections that mask 410 does not cover, which sections together make up the unmasked portion mentioned above. Note that mask 420 has been removed prior to the point in the manufacturing process depicted in FIG. 6, leaving an unmasked section in the region where mask 420 was originally located.

Figure 7:
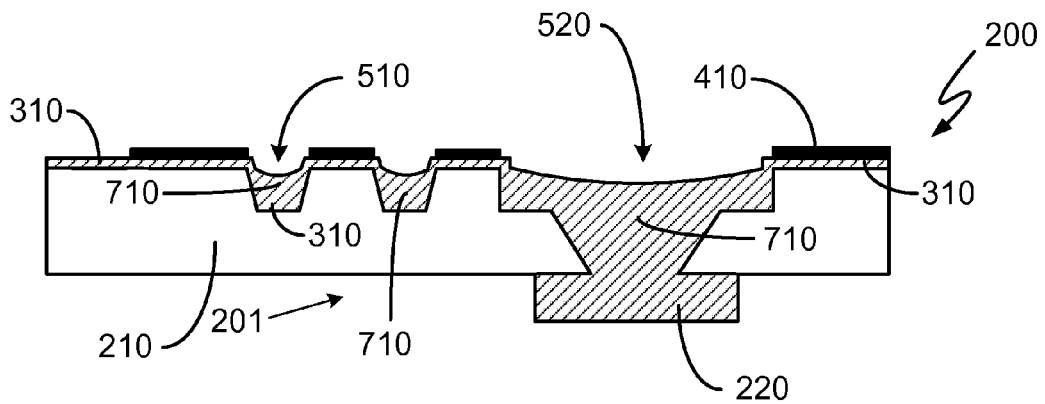

A step 130 of method 100 is to form a second (thick) electrically conductive layer only over the unmasked portion of the first electrically conductive layer. FIG. 7 is a cross-sectional view of a portion of workpiece 200 at a particular point in a manufacturing process according to the first embodiment of the invention. As an example, FIG. 7 may depict workpiece 200 after step 130 of method 100 has been performed. As illustrated in FIG. 7, an electrically conductive layer 710 has been formed over the unmasked portion of electrically conductive layer 310. As shown, electrically conductive layer 710 may plate up to the same level as electrically conductive layer 310 on the substrate surface. As an example, the electrically conductive layer referred to in step 130 of method 100 can be similar to electrically conductive layer 710.

Figure 8:
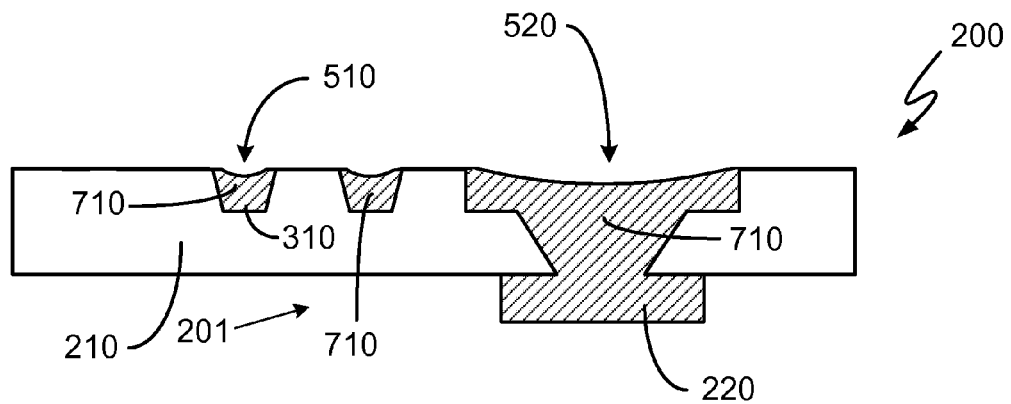

A step 140 of method 100 is to remove the mask and the masked portion of the first electrically conductive layer. FIG. 8 is a cross-sectional view of a portion of workpiece 200 at a particular point in a manufacturing process according to the first embodiment of the invention. As an example, FIG. 8 may depict workpiece 200 after step 140 of method 100 has been performed. As illustrated in FIG. 8, mask 410 and the masked portion of electrically conductive layer 310 have been removed, resulting in a workpiece with conductive traces electrically isolated from each other, as desired.

Figure 9:
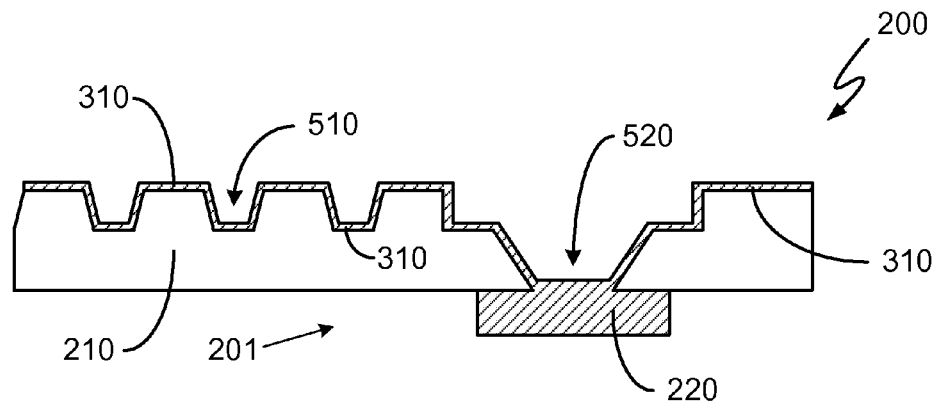
FIGS. 9-14 are cross-sectional views of a portion of a workpiece at various particular points in a manufacturing process according to a second embodiment of the invention.

FIG. 9 is a cross-sectional view of a portion of workpiece 200 at a particular point in a manufacturing process according to a second embodiment of the invention. As an example, FIG. 9 may depict workpiece 200 following the performance of step 110 of method 100 in the second embodiment.

As illustrated in FIG. 9, substrate 201 has been patterned prior to the formation of the first electrically conductive layer such that substrate 201 contains trenches 510 and via 520. In one embodiment, substrate 201 is patterned by ablating a portion of the substrate using an excimer laser. Other embodiments make use of other patterning methods such as other laser type techniques or imprinting techniques. As in the embodiment described above, electrically conductive layer 310 has been formed over substantially all of substrate 201, including within trenches 510 and via 520. In one embodiment, the substrate patterning is performed using laser projection patterning, in which certain regions of substrate 201 are ablated using an excimer laser. As an example, laser projection patterning may provide tighter control of feature width as well as minimize process steps relative to other patterning processes.

Figure 10:
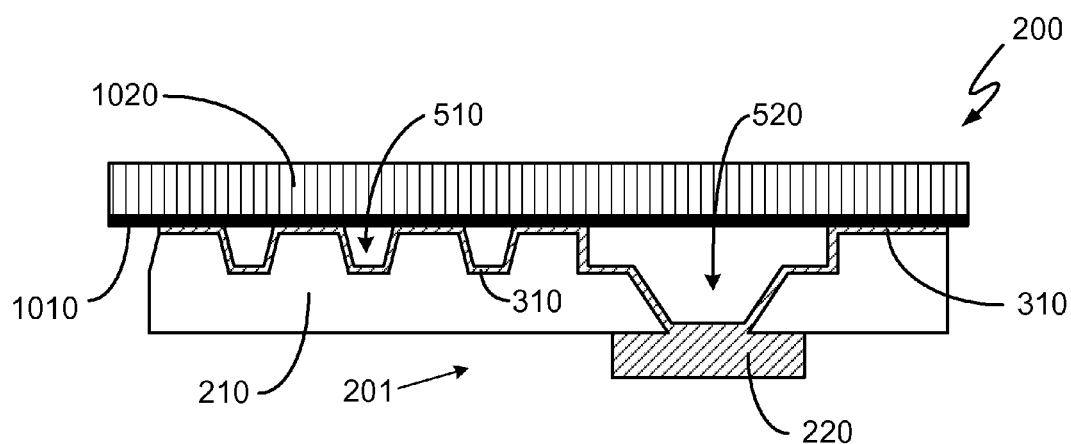
Figure 11:
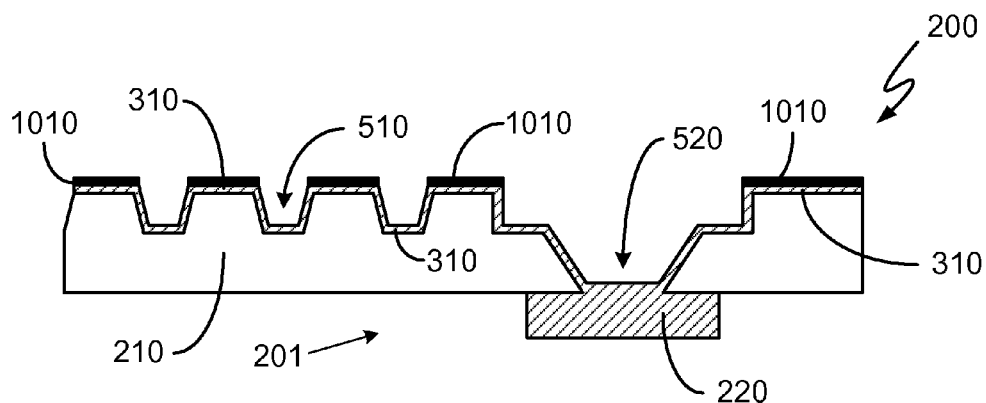

FIGS. 10 and 11 are cross-sectional views of a portion of workpiece 200 at particular points in a manufacturing process according to the second embodiment of the invention. As an example, FIG. 10 may depict workpiece 200 following the partial performance of step 120 of method 100 in the second embodiment and FIG. 11 may depict workpiece 200 following the further performance of step 120 of method 100. In the second embodiment of the invention, step 120 comprises applying a non-electrically conductive substance to sections of the first electrically conductive layer. As an example, the non-electrically conductive substance may act as the mask mentioned in step 120. In one embodiment, applying the non-electrically conductive substance comprises providing a stamp, applying the non-electrically conductive substance to the stamp, and stamping the first electrically conductive layer such that a layer of the non-electrically conductive substance is transferred to desired sections of the first electrically conductive layer.

As illustrated in FIG. 10, a non-electrically conductive substance 1010 has been applied to a stamp 1020 after which stamp 1020 has been placed on workpiece 200. As an example, the stamp referred to above can be similar to stamp 1020. As another example, stamp 1020 can be made to be as large as (or larger than) one or more dimensions (e.g., length or width) of the substrate or workpiece so that it is capable of stamping any location on the substrate or workpiece where such stamping may be needed or desired.

Stamp 1020 may be made of polydimethylsiloxane (PDMS) or the like. The application of non-electrically conductive substance 1010 to stamp 1020 may be made to occur, for example, when a hydrophobic and non-electrically conductive inking solution is brushed onto or otherwise placed on stamp 1020. (Other methods for transferring non-electrically conductive substance 1010 to stamp 1020 include rolling non-electrically conductive substance 1010 onto stamp 1020 with a coated roller, dipping stamp 1020 into a quantity of non-electrically conductive substance 1010, spin-coating non-electrically conductive substance 1010 onto stamp 1020, and similar methods.) Stamp 1020 may then be pressed onto a surface of workpiece 200 and removed, leaving behind a layer of the non-electrically conductive and hydrophobic polymer (i.e., non-electrically conductive substance 1010) on the surface of workpiece 200. This will provide an ultra-thin blanket on the surface of workpiece 200 (though not in the trenches or vias) that will prevent copper (or other plating material) from plating in the stamped area.

FIG. 11 illustrates workpiece 200 after the removal of stamp 1020, at which time a layer 1110 of non-electrically conductive substance 1010 has been left on electrically conductive layer 310. As an example, the mask referred to in step 120 of method 100 can be similar to layer 1110 of non-electrically conductive substance 1010. Note that FIG. 11 depicts electrically conductive layer 310 as having a masked portion made up of those sections of electrically conductive layer 310 that are covered with layer 1110, and an unmasked portion made up of those sections of electrically conductive layer 310 that are not covered with layer 1110.

Figure 12:
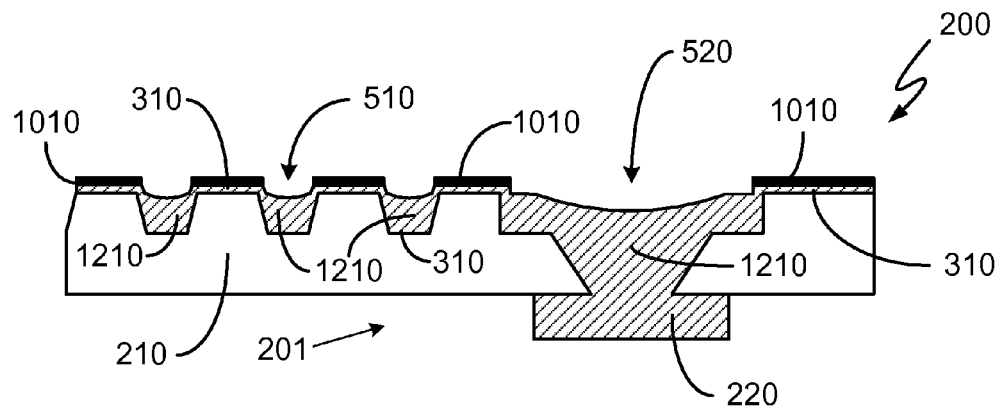

FIG. 12 is a cross-sectional view of a portion of workpiece 200 at a particular point in a manufacturing process according to the second embodiment of the invention. As an example, FIG. 12 may depict workpiece 200 following the performance of step 130 of method 100 in the second embodiment. As illustrated in FIG. 12, an electrically conductive layer 1210 has been formed over the unmasked portion of electrically conductive layer 310. As shown, electrically conductive layer 1210 may plate up to the same level as electrically conductive layer 310 on the substrate surface. As an example, the electrically conductive layer referred to in step 130 of method 100 can be similar to electrically conductive layer 1210.

Figure 13:
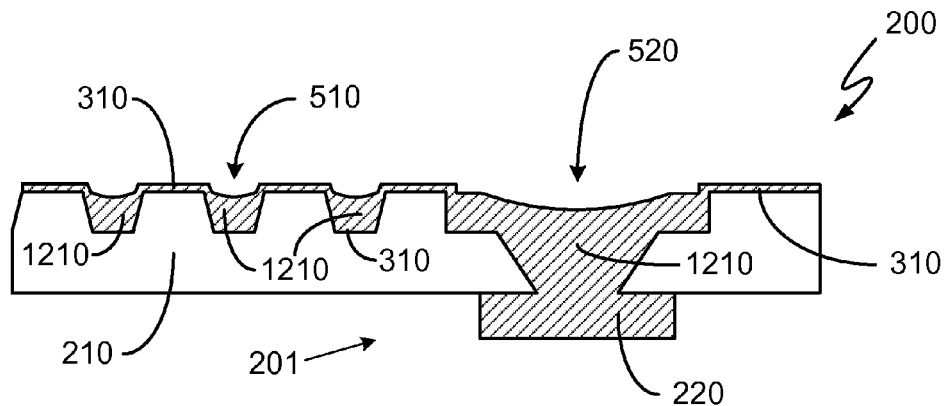
Figure 14:
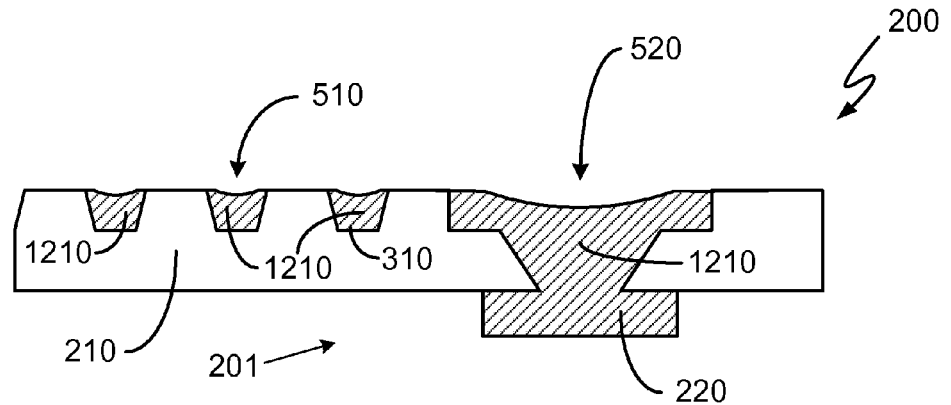

FIGS. 13 and 14 are cross-sectional views of a portion of workpiece 200 at particular points in a manufacturing process according to the second embodiment of the invention. As an example, FIG. 13 may depict workpiece 200 following the partial performance of step 140 of method 100 in the second embodiment and FIG. 14 may depict workpiece 200 following the further performance of step 140 of method 100 in the second embodiment. As illustrated in FIG. 13, non-electrically conductive substance (mask) 1010 has been removed and as illustrated in FIG. 14, the masked portion of electrically conductive layer 310 has been removed, resulting in a workpiece with conductive traces electrically isolated from each other, as desired.

Figure 15:
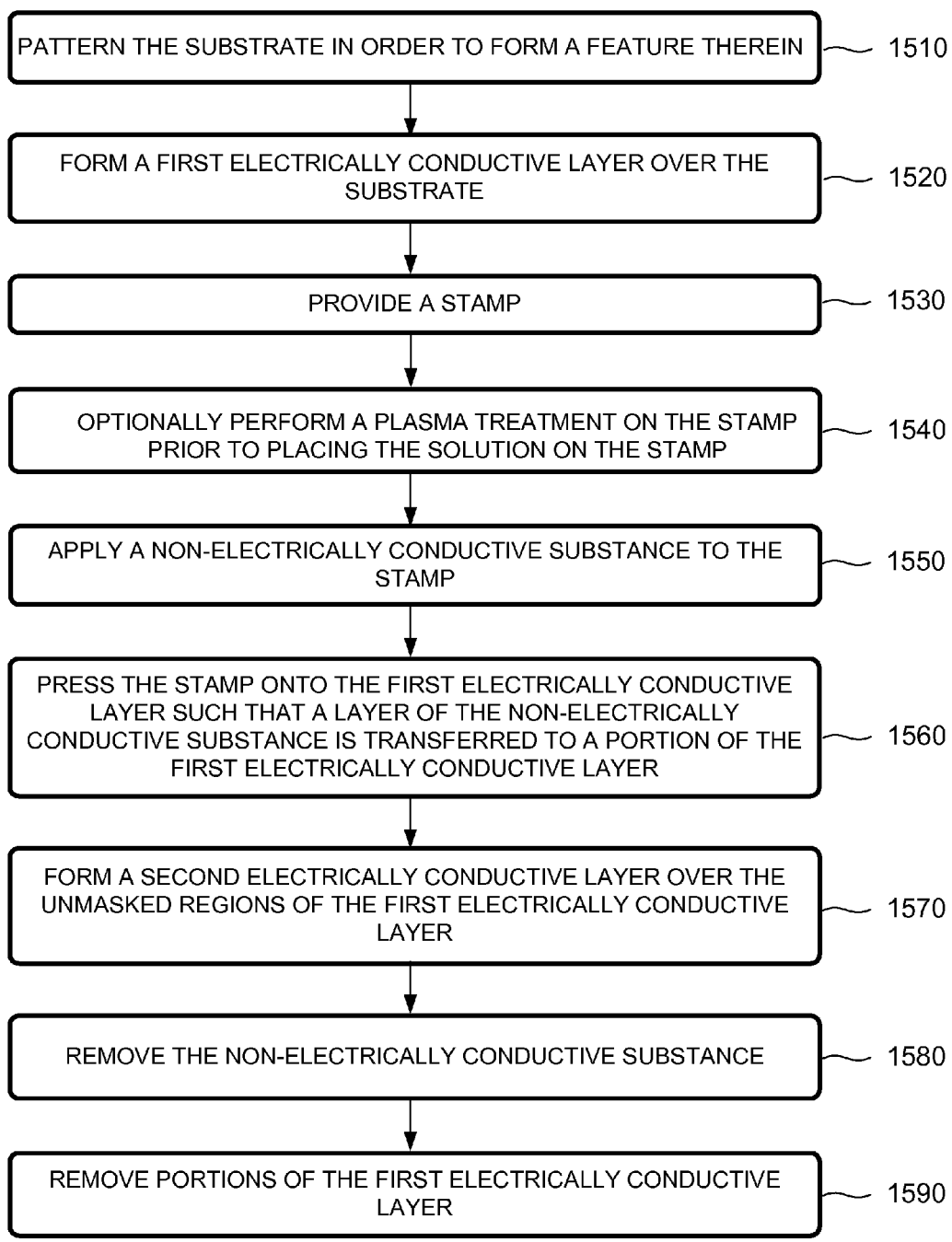
FIG. 15 is a flowchart illustrating a method of enabling selective area plating on a substrate according to an embodiment of the invention.

FIG. 15 is a flowchart illustrating a method 1500 of enabling selective area plating on a substrate according to an embodiment of the invention. Method 1500 may be similar, at least in certain respects, to the second embodiment of method 100 that is described above.

A step 1510 of method 1500 is to pattern the substrate in order to form a feature therein. In one embodiment, step 1510 comprises forming the feature by laser ablation using an excimer laser in an LPP process. In other embodiments, imprinting, laser treatment, or any other patterning technique may be used. After patterning, the substrate surface may be desmeared by a desmear process as known in the art in order to remove any resin residue from the pattern surface, or it can be subjected to alternative treatments such as plasma cleaning with carbon tetrafluoride ($CF_4$) or ammonia or oxygen, followed by plasma functionalization of the surface by plasma grafting to enable stronger adhesion between the dielectric and copper. Plasma grafting can be accomplished using a series of chemical compounds available on the market, such as carboxylate moieties on small organic units.

A step 1520 of method 1500 is to form a first electrically conductive layer over the substrate. FIG. 9 is a depiction of the possible appearance of the substrate following the performance of step 1520. As an example, the first electrically conductive layer can be similar to electrically conductive layer 310 as depicted in FIG. 9. In one embodiment, step 1520 comprises electrolessly depositing a first copper layer over the substrate. As an example, step 1520 may comprise an electroless plating procedure that utilizes palladium (Pd) seeding (either with Pd ions or a palladium/tin (Pd/Sn) colloid chemistry) followed by self-catalyzed copper deposition. Electroless copper will cover the entire surface of the panel (including protruding edges—between adjacent traces). In other embodiments other metallization methods, such as sputtering or electron beam evaporation, may also be used.

A step 1530 of method 1500 is to provide a stamp. As an example, the stamp can be similar to stamp 1020 that is shown in FIG. 10.

A step 1540 of method 1500 is to perform a plasma treatment on the stamp prior to placing the solution on the stamp. As mentioned above, such plasma treatment may or may not be necessary in order to increase the wettability of the stamp to the polymer and/or in order to enable continuous coating of a dilute solution such as PMMA. If plasma treatment is not necessary it may of course be omitted from method 1500, and step 1530 may be followed immediately by step 1550.

A step 1550 of method 1500 is to apply a non-electrically conductive substance to the stamp. As an example, the non-electrically conductive substance can be similar to non-electrically conductive substance 1010 that is first shown in FIG. 10. In one embodiment, step 1550 comprises applying a polymer to a portion of a surface of the stamp. In a particular embodiment, applying the polymer comprises providing a solution that includes the polymer and a solvent and further comprises placing the solution on the stamp. In one embodiment, placing the solution on the stamp comprises brushing the stamp with the solution, and in a different embodiment, placing the solution on the stamp comprises spin coating or roller coating the solution onto the stamp.

Various embodiments of the invention may use any suitable stamp chemistry, inking solution, and stamping technique (including inking procedure (the application of polymer to the stamp), cleaning procedure (the removal of the polymer from the stamp), and stamping procedure (the application of the inking solution to the substrate)). Further details regarding the stamp, the inking procedure, and the stamping procedure according to a particular embodiment or embodiments of the invention are as follows. A stamp (whether made of PDMS, another rubbery material, or some other type of material) is prepared and brushed with poly(styrene) from a solution of 0.5M polystyrene in 8:2 ethanol:toluene and left to dry. This will prime the surface of the stamp with a non-electrically conductive and hydrophobic polymer which can be transferred to the surface of the substrate. The surface of the stamp may need to be treated by $O_2$ plasma or the like before the application of the polymer in order to increase its wettability to the polymer.

The stamp is then brought into contact with the surface of the substrate, and pressure is applied. Stamping pressure across the entire surface must be properly optimized in order to assure that the polymer transfer is adequate and the same across different areas of the surface. Temperature, pressure, and stamping frequency (or the number of stamps done—each, in one embodiment, with a fresh polymer brushing) are key characteristics to assure proper surface coverage of the poly(styrene) on the substrate. Note that one application of the stamp will transfer several molecular layers onto the surface of the substrate. Repetitive stamping may or may not be needed. Furthermore, although the illustrated stamp is flat, other stamp configurations may also be used such as, for example, a semicircular stamp capable of rolling over the surface that is to be stamped.

An inking solution according to one embodiment of the invention (the polystyrene in ethanol/toluene) was given above. In another embodiment, the inking chemistry comprises a solution of approximately 2.5 percent by weight of poly(styrene sulfonate)-block-poly (ethylene-ran-butylene)-block-poly(styrene sulfonate) (PEBS) in a mixture of ethanol, propanol, dichlororethane and tetrahydrofuran. In another embodiment, the inking chemistry comprises a solution of between approximately 3 percent by weight and approximately 20 percent by weight polymethyl methacrylate (PMMA) in methoxy-propyl acetate. In yet another embodiment, the inking chemistry comprises a liquid photoresist. The solution is spin or roller coated to the stamp in order to get a film thickness ranging from the sub-micrometer range up to approximately 2 micrometers. Plasma treatment of the stamp surface may likely be needed in order to get continuous coating of the dilute PMMA solution.

A step 1560 of method 1500 is to press the stamp onto the first electrically conductive layer such that a layer of the non-electrically conductive substance is transferred to a portion of the first electrically conductive layer. FIG. 11 is a depiction of the possible appearance of the substrate following the performance of step 1560. Note that following the transfer of the non-electrically conductive substance onto the portion of the first electrically conductive layer, the first electrically conductive layer has masked regions (regions that are covered with the non-electrically conductive substance) and unmasked regions (regions that are not covered with the non-electrically conductive substance).

A step 1570 of method 1500 is to form a second electrically conductive layer over the unmasked regions of the first electrically conductive layer. FIG. 12 is a depiction of the possible appearance of the substrate following the performance of step 1570. As an example, the second electrically conductive layer can be similar to electrically conductive layer 1210, first shown in FIG. 12. In one embodiment, step 1570 comprises electroplating the substrate with a second copper layer by using an electrolytic plating process.

A step 1580 of method 1500 is to remove the non-electrically conductive substance. FIG. 13 is a depiction of the possible appearance of the substrate following the performance of step 1580. In one embodiment, the non-electrically conductive substance may be removed by washing the substrate repetitively with, depending on the inking solution, ethanol/toluene or with propanol/dichloroethane/tetrahydrofuran/ethanol. Methoxy-propyl acetate may be used to wash away PMMA film.

A step 1590 of method 1500 is to remove portions of the first electrically conductive layer. The removed portions are those portions that were masked with the non-electrically conductive substance prior to the removal in step 1580 of the non-electrically conductive substance. FIG. 13 is a depiction of the possible appearance of the substrate following the performance of step 1590. In one embodiment, step 1590 comprises a quick etch (QE). The quick etch tends to be effective because the portions of the first electrically conductive layer that it is intended to remove are on the order of a micrometer or less in thickness. Also, QE chemistry is industrially aimed at removal of electroless copper, which is generally the first metallization layer. As known in the art, a quick etch that is effective for the removal of thin layers is not likely to be effective or appropriate for the removal of thicker layers of material. Embodiments of the invention ensure that a thin electroless layer is all that remains for removal, such that a quick etch procedure will be sufficient. The quick etch may in some embodiments be followed by a roughening etch or some other adhesion promotion procedure.

Figure 16:
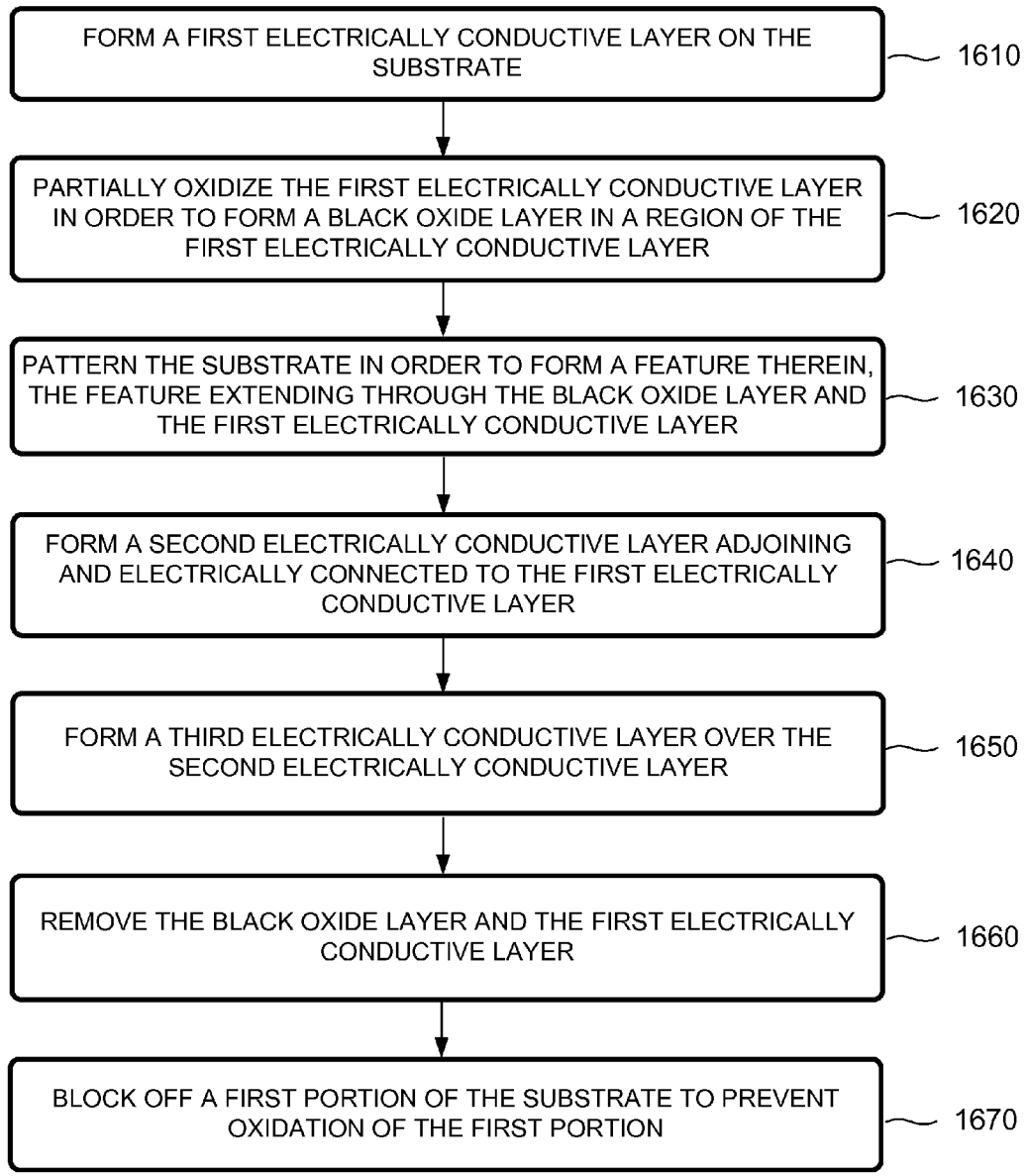
FIG. 16 is a flowchart illustrating a method of enabling selective area plating on a substrate according to an embodiment of the invention.

FIG. 16 is a flowchart illustrating a method 1600 of enabling selective area plating on a substrate according to an embodiment of the invention. Method 1600 may be similar, at least in certain respects, to the first embodiment of method 100 that is described above.

A step 1610 of method 1600 is to form a first electrically conductive layer on the substrate. FIG. 3 is a depiction of the possible appearance of the substrate following the performance of step 1610. As an example, the first electrically conductive layer can be similar to electrically conductive layer 310 as depicted in FIG. 3. In one embodiment, step 1610 comprises electrolessly depositing a first copper layer on the substrate. As an example, step 1610 may comprise an electroless plating procedure that utilizes palladium (Pd) seeding (either with Pd ions or a palladium/tin (Pd/Sn) colloid chemistry) followed by self-catalyzed copper deposition. Electroless copper will cover the entire surface of the panel (including protruding edges—between adjacent traces).

A step 1620 of method 1600 is to partially oxidize the first electrically conductive layer in order to form a black oxide layer in a region of the first electrically conductive layer. FIG. 4 is a depiction of the possible appearance of the substrate following the performance of step 1620. As an example, the black oxide layer can be similar to mask 410, first shown in FIG. 4. Certain areas at panel edge (under mask 420) will be covered during black oxide treatment so that they may remain as conductive copper. These areas will be used to make the electrical connections for subsequent electrolytic plating.

A step 1630 of method 1600 is to pattern the substrate in order to form a feature (or features) therein, the feature extending through the black oxide layer, the first electrically conductive layer, and an underlying polymer dielectric. FIG. 5 is a depiction of the possible appearance of the substrate following the performance of step 1630. As an example, the feature can be similar to trenches 510 or via 520, both of which are first shown in FIG. 5. In one embodiment, step 1630 comprises forming the feature by laser ablation using an excimer laser in an LPP process. Other embodiments use another laser patterning technique. (Any laser system in any configuration may be used.) In one embodiment, the total thickness of the black oxide layer and the first electrically conductive layer is less than approximately 2 micrometers, which will impact LPP throughput time (TPT) only slightly.

A step 1640 of method 1600 is to form a second electrically conductive layer adjoining and electrically connected to the first electrically conductive layer. FIG. 6 is a depiction of the possible appearance of the substrate following the performance of step 1640. As an example, the second electrically conductive layer can be similar to the extensions of electrically conductive layer 310 that show up for the first time in FIG. 6. In one embodiment, step 1640 comprises electrolessly depositing a second copper layer on the substrate. Electroless copper will not form on top of the black oxide cover areas because the palladium catalyst used in the electroless deposition tends not to adhere to black oxide. Electroless copper formed at the trenches and vias connects with the electroless copper originally formed at the substrate surface, thus forming continuous coverage of copper over the whole surface of the substrate.

A step 1650 of method 1600 is to form a third electrically conductive layer over the second electrically conductive layer. FIG. 7 is a depiction of the possible appearance of the substrate following the performance of step 1650. As an example, the third electrically conductive layer can be similar to electrically conductive layer 710, first shown in FIG. 7. In one embodiment, step 1650 comprises electroplating the substrate with a third copper layer in an electrolytic plating procedure.

As an example, step 1650 may comprise a plating procedure that utilizes direct current (DC) in a batch (or continuous) mode. This plating technique will ensure a maximum copper thickness variation across the substrate (or larger panel) of approximately 5 micrometers. Although some recessing may be expected over embedded features on the substrate, such recessing will be of little concern because it will be etched back in a subsequent planarization step. More generally, any electrolytic plating chemistry, solution flow, and current profile (including DC and periodic reverse pulse plating (PRPP)) may be used.

A step 1660 of method 1600 is to remove the black oxide layer and the first electrically conductive layer. FIG. 8 is a depiction of the possible appearance of the substrate following the performance of step 1660. In one embodiment, step 1660 comprises a quick etch (more fully discussed above). The quick etch may in some embodiments be accompanied by an acid etch.

A step 1670 of method 1600 is to block off a first portion of the substrate to prevent oxidation of the first portion. As an example, step 1670 may be used along an edge of a panel containing many substrates and where it is necessary to place a clamp (and therefore where an electrically conductive region is needed). As an example, the first portion of the substrate may be blocked using sticky tape or another adhesive material such as is represented by mask 420 (first shown in FIG. 4). When it is performed as part of method 1600, step 1670 may be performed between steps 1610 and 1620.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the methods of enabling selective area plating on a substrate discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of enabling selective area plating on a substrate, the method comprising:
    forming a first electrically conductive layer over substantially all of the substrate;
    covering sections of the first electrically conductive layer with a mask such that the first electrically conductive layer has a masked portion and an unmasked portion;
    partially oxidizing the first electrically conductive layer in order to form a black oxide layer in a region of the first electrically conductive layer; and
    patterning the substrate in order to form a feature therein, the feature extending through the black oxide layer and the first electrically conductive layer;
    forming a second electrically conductive layer, the second electrically conductive layer forming only over the unmasked portion of the first electrically conductive layer; and
    removing the mask and the masked portion of the first electrically conductive layer.

2. The method of claim 1 wherein:
    patterning the substrate comprises ablating a portion of the substrate using an excimer laser.

3. A method of enabling selective area plating on a substrate, the method comprising:
    forming a first electrically conductive layer on the substrate;
    partially oxidizing the first electrically conductive layer in order to form a black oxide layer in a region of the first electrically conductive layer;
    patterning the substrate in order to form a feature therein, the feature extending through the black oxide layer and the first electrically conductive layer;
    forming a second electrically conductive layer adjoining and electrically connected to the first electrically conductive layer;

forming a third electrically conductive layer over the second electrically conductive layer; and removing the black oxide layer and the first electrically conductive layer.

4. The method of claim 3 wherein:

patterning the substrate comprises forming the feature using an excimer laser.

5. The method of claim 3 wherein:

forming the first electrically conductive layer comprises electrolessly depositing a first copper layer on the substrate.

6. The method of claim 3 further comprising:
blocking off a first portion of the first conductive layer to prevent oxidation of the first portion.

7. The method of claim 5 wherein:
forming the second electrically conductive layer comprises electrolessly depositing a second copper layer on the substrate.

8. The method of claim 7 wherein:
forming the third electrically conductive layer comprises electroplating the substrate with a third copper layer.

* * * * *